United States Patent [19]

Dentai et al.

[11] Patent Number: 4,774,554

[45] Date of Patent: Sep. 27, 1988

[54] SEMICONDUCTOR DEVICES EMPLOYING TI-DOPED GROUP III-V EPITAXIAL LAYER

[75] Inventors: Andrew G. Dentai, Atlantic Highlands; Charles H. Joyner, Jr., Middletown, both of N.J.

[73] Assignee: American Telephone and Telegraph Company, AT&T Bell Laboratories, Murray Hill, N.J.

[21] Appl. No.: 942,453

[22] Filed: Dec. 16, 1986

[51] Int. Cl.$^4$ ............................................. H01L 33/00
[52] U.S. Cl. ....................................... 357/17; 357/16; 357/63
[58] Field of Search ............................ 357/17, 16, 63; 148/175; 156/606

[56] References Cited

U.S. PATENT DOCUMENTS

| | | | |
|---|---|---|---|
| 3,492,175 | 1/1970 | Conrad et al. | 148/175 |
| 3,867,202 | 2/1975 | Ichiki et al. | 148/175 |
| 3,979,235 | 9/1976 | Boucher | 148/175 |
| 4,193,835 | 3/1980 | Inoue et al. | 156/606 |
| 4,202,893 | 5/1980 | Cox | 148/175 |
| 4,368,098 | 1/1983 | Manasevit et al. | 156/606 |

OTHER PUBLICATIONS

Moss, R. H. and Evans, J. S., "A New Approach to MOCVD of Indium Phosphide and Gallium-Indium Arsenide," 1981, pp. 129–134, Journal of Crystal Growth, North-Holland Publishing Company.

Bass, S. J. et al., "Metal Organic Vapour Phase Epitaxy of Indium Phosphide," 1983, pp. 68–75, Journal of Crystal Growth 64, North-Holland Publishing Company.

Hsu, C. C. et al., "OMVPE Growth of InP Using TMIn," 1983, pp. 8–12, Journal of Crystal Growth 63, North-Holland Publishing.

Hurle, D. T. J. et al., "GaInAs and GaInAsP Materials Grown by Low Pressure MOCVD for Microwave and Optoelectronic Applications," 10/81, pp. 64–73, Journal of Crystal Growth, North-Holland Publishing Company.

Alferov, Ah I. et al., "Buried InGaAsP/InP Stripe Heterojunction cw Lasers Fabricated by Combined Liquid- and Gas-Phase Epitaxy," 6 /82, pp. 296 and 299, Soviet Technical Physics Letters.

Long, J. A. et al., "Growth of Fe-Doped Semi-Insulating InP by MOCVD," 5/84, pp. 10–14, Journal of Crystal Growth, North-Holland, Amsterdam.

Speier, P. et al., "MOVPE Growth and Characteristics of Fe-Doped Semi-Insulating InP Layers," 11/86, vol. 22, No. 23, pp. 1216–1217, Electronics Letters.

Nakai, K. et al., "Growth of Iron-Doped Epitaxial Layers for GaAs Field Effect Transistors," 10/77, vol. 124, No. 10, pp. 1635–1640, J. Electrochem. Soc.-:Solid-State Science and Technology.

Brandt, C. D. et al., "New Semi-Insulating InP: Titanium Midgap Donors," 4/86, Applied Physics Letters 48(17).

Mito, I. et al., "InGaAsP Double-Channel-Planar-Buried Heterostructure Laser Diode (DC-PB-H-LC) with Effective Current Confinement" 3/83, Journal of Lightwave Technology, vol. Lt-1, No. 1, pp. 195–201.

Wilt, D. P. et al., "Channeled Substrate Buried Heterostructure InGaAsP/InP Laser Employing a Buried Fe Ion Implant for Current Confinement," Applied Physics Letter 44(3), 2/84, pp. 290–292.

Primary Examiner—Robert S. Macon
Attorney, Agent, or Firm—Gregory C. Ranieri

[57] ABSTRACT

High resistivity Ti-doped Group III-V-based MOCVD layers are used to constrain current to flow through the active region of a variety of devices such as CSBH and DCPBH lasers.

14 Claims, 2 Drawing Sheets

SEMICONDUCTOR DEVICES EMPLOYING TI-DOPED GROUP III-V EPITAXIAL LAYER

TECHNICAL FIELD

This invention relates to semiconductor device structures and, more particularly, to those device structures employing a layer of semi-insulating material.

BACKGROUND OF THE INVENTION

Group III-V semiconductor materials continue to be selected for use in the fabrication of various light sensitive, light emitting and electronic devices. The ultimate operation and performance of these devices is dependent upon the amount of leakage current present. Leakage currents are those which bypass the desired current path such as the active region in a device. In devices such as buried heterostructure (BH) semiconductor lasers, for example, leakage currents lead to high lasing threshold, low differential quantum efficiency, abnormal temperature dependence on threshold current, and rollover of the light-current (L-I) characteristic. All of these factors stemming from leakage currents have a serious negative impact on the use of the lasers as transmitters in optical communication systems.

An effective approach for blocking the flow of leakage currents through undesired paths is to introduce a layer of high resistivity material into the semiconductor structure. Previously, high resistivity liquid phase epitaxial (LPE)$Al_{0.65}Ga_{0.35}As$ (lightly Ge-doped) material has been utilized for current confinement in AlGaAs/GaAs buried heterostructure (BH) lasers, but subsequent analogous attempts to produce high resistivity LPE InP material for this purpose in InGaAsP have not been successful. Deuteron bombardment has also been shown to produce highly resistive material from p-type InP, but this material is not expected to remain highly resistive during subsequent processing. In particular, because the high resistivity is related to deuteron implant damage, the resistivity anneals out at the high temperatures (e.g., above about 600° C.) required for subsequent LPE growth.

In addition, reverse-biased p-n junctions have also been reported for constraining current to flow through the active region of InGaAsP/InP lasers. These blocking junctions have been fabricated by the implantation of Be into n-InP substrates, by the diffusion of Cd into n-InP substrates, and by the epitaxial growth of a p-InP layer onto an n-InP substrate. But, all of these devices are impaired to some extent by leakage currents because of the imperfect blocking characteristics of the reverse-biased junctions.

More recently, D. P. Wilt et al. reported in *Applied Physics Letters*, Vol. 44, No. 3, p. 290 (Feb. 1984) that InP/InGaAsP CSBH lasers with relatively low leakage currents and low lasing thresholds can be fabricated by incorporating into the structure a high resistivity Fe-ion-implanted layer which constrains pumping current to flow through the active region. The high resistivity layer is produced by an Fe-ion implant into an n-type InP substrate followed by an annealing treatment prior to LPE growth. This laser is also the subject of copending application Ser. No. 549,160 filed on Nov. 8, 1983 by R. J. Nelson et al. Although the resistivity of the Fe-ion-implanted layer is stable even after being subjected to the high temperatures characteristic of LPE growth, the thinness of the Fe-implanted layer (about 0.4 $\mu$m) renders it difficult to reproducibly position the thin active layer (about 0.1-0.2 $\mu$m thick) adjacent thereto. When the active layer is not so placed, shunt paths are created which allow leakage current to flow around the active layer. Hence, high performance (low threshold, high efficiency) devices are hard to fabricate reproducibly.

More recently, it has been found that reproducible BH lasers with low leakage currents, low lasing thresholds, excellent high frequency response and good reliability can be fabricated by incorporating into the structure a relatively thick, high resistivity Fe-doped InP-based layer grown by metallo-organic chemical vapor deposition (MOCVD) using either a ferrocene-based or iron pentacarbonyl-based dopant precursor. Importantly, InP:Fe layers which are relatively thick (e.g., 1-4 $\mu$m) and highly resistive (e.g., $10^3$–$10^9$ $\Omega$-cm) are realized by this process, characteristics which are crucial to reducing leakage currents and increasing yields in a variety of devices.

While iron doping of indium phosphide is useful for producing high resistivity, semi-insulating semiconductor material, the resulting material has poor thermal stability. Moreover, since iron is a deep acceptor in indium phosphide and because the semi-insulating material is grown in contact with a p-n junction, the semi-insulating material is susceptible to being rendered conductive in the vicinity of the p-type material because rapidly diffusing p-type impurities such as zinc, cadmium, magnesium, and beryllium change the net carrier concentration from an excess of shallow donors toward an excess of shallow acceptors. This has, in turn, caused the search to continue for other dopants to form semi-insulating indium phosphide. Although a large number of alternate transition metal dopants (Co, Cr, and Mn) have been studied for use with indium phosphide, none has achieved a successful combination of good semi-insulating behavior and thermal stability.

Recently, it was reported that titanium doping of bulk indium phosphide resulted in high resistivity semiconductor material which also exhibited good thermal stability. The semi-insulating bulk crystals were grown by liquid encapsulated Czochralski techniques using pyrolytic boron nitride crucibles. See C. D. Brandt et al., *Appl. Phys. Lett.*, Vol. 48, No. 17, pp.1162-4 (1986). The high purity titanium source used for liquid encapsulated Czochralski growth is not suited for vapor phase or molecular beam epitaxial growth techniques. Moreover, the results fail to suggest a titanium source suitable for such epitaxial growth techniques which would be capable of producing semi-insulating indium phosphide exhibiting deep donor levels which result from titanium doping as opposed to deep acceptor levels associated with iron doping. While the reported results indicate that titanium doping is more desirable than iron doping in forming semi-insulating indium phosphide, the titanium source and growth techniques applied are incapable of producing or overgrowing semi-insulating indium phosphide epitaxial layers necessary for device fabrication.

SUMMARY OF THE INVENTION

Epitaxial layers of titanium-doped indium phosphide have been produced by a metal organic chemical vapor deposition (MOCVD) procedure in conjunction with a titanium-based metal organic dopant precursors. Layers of indium phosphide formed in accordance with the principles of the invention are semi-insulating, exhibit thermal stability, and permit overgrowth by other materials. Also, the titanium-doped, semi-insulating indium phosphide layers retain semi-insulating characteristics (high resistivity) even when grown in contact with p-type material provided that the concentration of deep donors from titanium exceeds the net concentration of shallow acceptors in the indium phosphide. It has been determined that co-doping or compensation doping of the indium phosphide layer by an organo-metallic acceptor is an efficient way to reach the condition necessary to ensure semi-insulating material, namely, $N_{Ti} > N_A - N_D$ where $N_{Ti}$ is the deep donor concentration from titanium, $N_D$ is the shallow donor concentration and $N_A$ is the total shallow acceptor concentration including the background acceptor concentration, the acceptor concentration from diffusion and the acceptor concentration from co-doping.

The principles of this invention also extend to epitaxial growth by MOCVD of other Group III-V compounds such as the binary compositions of indium phosphide or gallium antimonide and the ternary and quaternary derivatives thereof. Additionally, it has been found that the combination of titanium doping and iron doping results in a semi-insulating epitaxial Group III-V layer which is capable of trapping background excess carriers regardless of the net background carrier concentration.

Group III-V Ti epitaxially grown layers may be utilized as the current-blocking layers of the CSDH laser or a double channel planar buried heterostructure laser (DC-PBH). In addition, the Ti-doped semi-insulating epitaxial layers are suitable for use in LEDs, photodiodes, and other Group III-V devices in which current is constrained to flow in a channel through the selected region of the device.

BRIEF DESCRIPTION OF THE DRAWING

A more complete understanding of the invention may be obtained by reading the following description of specific illustrative embodiments of the invention in conjunction with the appended drawing in which, in the interests of clarity, the figures have not been drawn to scale.

DETAILED DESCRIPTION

Figure 1:
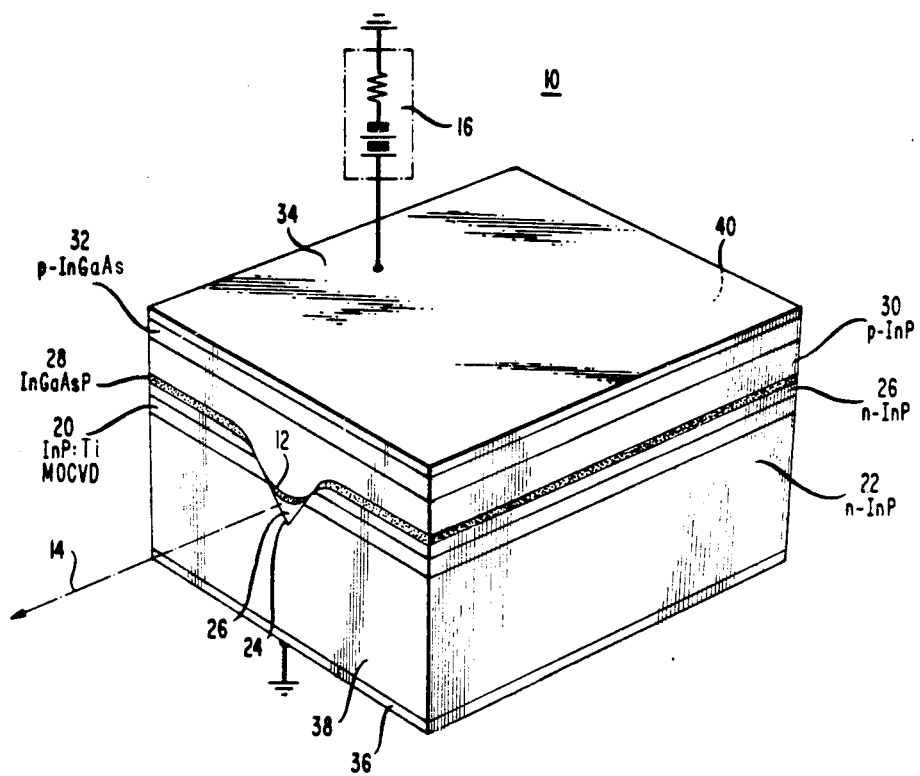
FIG. 1 is an isometric view of a CSBH light emitting device in accordance with the principles of our invention.

The following description is divided into two parts, namely, a discription of the growth technique for the semi-insulating material and a description of exemplary devices employing a layer of the titanium-doped semi-insulating material. While the devices described herein are light emitting devices, this should not be construed as a limitation. It is to be understood that the use of this invention extends to other photonic and electronic devices employing Group III-V semiconductor materials.

DESCRIPTION OF GROWTH TECHNIQUE FOR SEMI-INSULATING MATERIAL

MOCVD growth of titanium-doped, semi-insulating, Group III-V material is described in a co-pending and concurrently filed patent application Ser. No. 942,452, entitled "Semi-Insulating Group III-V Based Compositions" (A. G. Dentai et al. That patent application is incorporated herein by reference.

The growth technique involves the use of a titanium-based metal organic dopant precursor and in some cases p-type co-dopant in conjunction with an indium-based organic material to produce growth of a semi-insulating, indium phosphide-based material and ultimately to produce a semiconductor device. It is understood by those skilled in the art that the term "semi-insulating" implies a resistivity greater than or equal to $10^3$ ohm-cm. The metal organic deposition of indium phosphide has been extensively described in articles such as "GaAs and Related Compounds," J. P. Duchemin et al., *Institute of Physics Conference Series* 45, 1979, page 45; "International Meeting on the Relationship Between Epitaxial Growth Conditions and the Properties of Semiconductor Epitaxial Layers," A. K. Chatterjee et al., Perpignan, France, 1982. The particular indium-based organic material utilized for deposition of the indium phosphide-based material in conjunction with the titanium-based metal organic dopant precursor is not critical. Typically, indium alkyls such as trimethyl indium and triethyl indium, where the alkyl preferably has 1 to 5 carbon atoms, in conjunction with a source of phosphorus such as phosphine produce indium phosphide of satisfactory quality.

In a preferred embodiment, trimethyl indium is introduced into the gas stream by flowing a carrier gas such as hydrogen or an inert gas such as nitrogen or helium through a bubbler containing trimethyl indium. It is desirable that the gas be relatively pure so that impurities are not introduced into the deposited indium phosphide. For example, it is advantageous but not essential to employ high purity hydrogen that is further purified by palladium diffusion. Sufficient carrier gas is then flowed through the bubbler to produce a saturated combination of carrier gas and gas-based precursor. It should be noted that, while saturation of the gas flow is not a necessary condition, control is achieved by utilizing a saturated gas flow. A saturated gas flow is particularly important when growing ternary and quaternary indium phosphide-based materials. Typically, gas flows in the range 50 to 2000 sccm are utilized with a bubbler heated to a temperature in the range −20 to +20 degrees C. to produce a saturated gas flow. In experimental practice, controlled samples are employed to determine suitable conditions for producing saturation for a given indium-based organic composition.

A source of phosphorus such as phosphine is also introduced into the gas flow. Generally, it is desirable to have a molar excess of phosphorus source to organic indium-based compound of at least 50:1 and preferably at least 75:1. Typically ratios greater than 100:1, although not precluded, are also not desirable since they are uneconomic.

The dopant precursor, a metal organic titanium based composition, is introduced to yield a molar ratio in the gas stream of titanium to indium in the range $10^{-3}$ to $10^{-6}$. Molar ratios significantly higher than $10^{-3}$ lead to inclusion of a second composition phase in the deposition while molar ratios less than $10^{-6}$ lead to insufficient resistivities in deposited indium phosphide-based layers having a net carrier concentration of approximately $N_A - N_D \sim 2 \times 10^{15}$ cm$^{-3}$.

Several organo-metallic titanium-based dopant precursor compositions are employable. For example, metal organic titanium-based compounds from the titanium amine group, the titanium arene group and the titanium alkyl group are employable. In particular, the metal organic titanium-based compounds suggested as precursors are:

| | | |
|---|---|---|
| tetrakis(diethylamino)titanium | } | amine |
| bis(benzene)titanium | } | |
| bis(toluene)titanium | } | arene |
| bis(mesitylene)titanium | | |
| tetrabenzyl titanium | } | alkyl |

In order to be useful as precursors, the titanium bearing species should have an appreciable vapor pressure (greater than $1 \times 10^{-3}$ torr) at temperatures less than 100° C. Moreover, it is desirable for the selected species to decompose thermally, catalytically or otherwise at temperatures below 850° C. leaving volatile by-products behind while depositing titanium based metals at the growth site.

Conventional techniques are utilized to introduce the dopant precursor. For example, in the case of tetrakis(-diethylamino)titanium, which is a liquid at room temperature, a gas flow such as a nitrogen gas flow is bubbled through the tetrakis(diethylamino)titanium. Typical gas flows in the range 10 to 70 sccm at a temperature in the range 0° to 50° C. produce the desired ratio of indium to titanium in the gas stream. For metal organic titanium based dopant precursors which require use of an effusion source, a carrier gas flow is first introduced into a gas flow control means such as an electronic mass flow controller or needle valve that is adjusted to yield the desired titanium-to-indium ratio and then passed over the effusion source containing the precursor.

As described above, it has also been found that co-doping with an acceptor-based dopant precursor compensates donor impurities during indium phosphide growth and maintains the resistivity of the semi-insulating indium phosphide layer. Co-doping is essential when the net background donor concentration $(N_D - N_A)$ is greater than zero. Since titanium is a deep donor in indium phosphide-based compounds, it can only trap excess acceptors and not excess donors. In order to illustrate the latter point, co-doping has been omitted from the MOCVD growth of titanium-doped indium phosphide epitaxial layers during experimental investigation. It has been determined that the MOCVD growth equipment and growth parameters tend to produce epitaxial layers of indium phosphide in which the net background carrier concentration exhibits an excess of donor impurities over acceptor impurities. As a result, the titanium-doped indium phosphide layers grown with this particular MOCVD equipment were conductive with a resistivity less than 10 ohm-cm. When a cadmium-based co-dopant was introduced, the resistivity of the titanium-doped, indium phosphide epitaxial layers exceeded $10^7$ ohm-cm. Again, it is important to understand that the results discussed above concerning a need for co-doping are specific to the actual MOCVD growth equipment and growth parameters used experimentally here.

Acceptor-based dopant precursor compounds include organo-metallic cadmium based precursors, organo-metallic magnesium based precursors, organo-metallic zinc based precursors, and organo-metallic beryllium based precursors and organo-metallic germanium-based precursors. Specific exemplary acceptor based dopant precursor compounds include dimethyl cadmium, diethyl zinc, dimethyL zinc, bis(cyclopentadienyl)magnesium, bis(methylcyclopentadienyl)magnesium, diethyl beryllium, and tetramethyl germanium. The acceptor-based dopant precursor compounds are introduced to the gas flow by the standard techniques previously described.

It should be noted that co-doping is not limited to the use of the aforementioned materials alone. Other materials which are useful in preparing semi-insulating semiconductor material are acceptable and even desirable as co-dopants. For example, the use of iron as a co-dopant with titanium results in a semi-insulating material having deep traps for both electrons and holes. It is well known in the art that iron-based dopant precursor compositions include ferrocene based compositions or iron pentacarbonyl based compositions. The ferrocene based compositions comprise dimethyl ferrocene, vinyl ferrocene, and butyl ferrocene. The iron pentacarbonyl based compositions include butadiene iron tricarbonyl, cyclooctatetraene iron tricarbonyl, 1,3-pentadiene iron tricarbonyl, cyclohexadiene iron tricarbonyl, cycloheptadiene iron tricarbonyl, cycloheptatriene iron tricarbonyl, cyclopentadienyl iron dicarbonyl dimer, and methylcyclopentadienyl iron dicarbonyl dimer.

Although the deposition process has been described in terms of indium phosphide, the principles of this invention also extend to indium phosphide-based materials in general, that is, indium phosphide as well as ternary and quaternary derivatives thereof which include both indium and phosphorus. These indium phosphide-based materials are represented as $In_xGa_{1-x}As_yP_{1-y}$ and $In_xGa_{1-x}Al_yP_{1-y}$, where $0 < x \leq 1$ and $0 \leq y < 1$. The principles of this invention also extend to the gallium antimonide-based materials in general, that is, gallium antimonide as well as ternary and quaternary derivatives thereof which include both gallium and antimony. These gallium antimonide-based materials are represented as $In_xGa_{1-x}As_ySb_{1-y}$ and $Al_xGa_{1-x}As_ySb_{1-y}$, where $0 \leq x < 1$ and $0 \leq y < 1$. In the derivative systems, either arsenic or gallium or aluminum or antimony or a combination of arsenic, gallium, antimony and aluminum is introduced into the gas stream by expedients such as an admixture of $AsH_3$ and use of a bubbler containing alkyl gallium and/or alkyl aluminum compounds, respectively, as described in *Journal of Crystal Growth*, 55, 64 (1981), by J. P. Duchemin et al. Formation of device active regions and completion of a semiconductor device are then accomplished by conventional techniques.

DESCRIPTION OF DEVICES EMPLOYING TI-DOPED SEMI-INSULATING MATERIAL

The semiconductor light emitting device shown in FIG. 1 may be used as a laser or as an edge-emitting LED. In either case, the device 10 includes an active region 12 in which the recombination of electrons and holes casues radiation to be emitted at a wavelength characteristic of the bandgap of the semiconductor material of the active region (e.g., about 1.0–1.65 μm for InGaAsP depending on the specific composition of the alloy). The radiation is directed generally along axis 14 and is primarily stimulated emission in the case of a laser and primarily spontaneous emission in the case of an LED.

This recombination radiation is generated by forward-biasing a p-n junction which casues minority carriers to be injected into the active region. Source 16, illustratively depicted as a battery in series with a current-limited resistor, supplied the forward bias voltage and, in addition, provides pumping current at a level commensurate with the desired optical output power. In a laser, the pumping current exceeds the lasing current threshold.

In general, the device includes means for constraining the pumping current to flow in a relatively narrow channel through the active region 12. As illustrated, this constraining means comprises a bifurcated, high resistivity Ti-doped MOCVD InP layer 20, and the active region 12 has the shape of a stripe which lies in the rectangular opening of the bifurcated layer 20. Note, in the case of a surface emitting LED the layer 20, rather than being bifurcated, might take the shape of an annulus surrounding a cylindrical or mesa-like active region.

The structure shown in FIG. 1 is known as a channeled-substrate buried heterostructure (CSBH) laser which includes an n-InP substrate 22 and a Ti-doped MOCVD, high resistivity InP layer 20 which is bifurcated by a groove 24. The groove is etched or otherwise formed through layer 20 into substrate 22. A preferred technique for controllably etching the groove in the shape of a V is described in U.S. Pat. No. 4,595,454 issued June 17, 1986 to W. C. Dautroment et al. That patent is incorporated herein by reference.

Briefly, this etching technique entails the use of a composite etch mask comprising a thin (e.g., 18–22 Å) native oxide layer formed on a (100)-oriented InP surface and a $SiO_2$ layer plasma deposited on the native oxide. The native oxide layer may be grown using plasma enhanced or thermal methods. The mask is patterned using standard photolithography and plasma etching so that the mask openings ($\leq 2.2$ μm wide) are parallel to the [011] direction. V-grooves that are 3.0 μm deep with oly (111)B-oriented sidewalls are formed by room temperature etching in HCl-rich etchants such as 3:1 $HCl:H_3PO_4$.

The following essentially lattice-matched epitaxial layers are then grown by LPE on the etched wfer: an n-InP first cladding layer 26 (the central portion of which fills at least the bottom portion of groove 24); an unintentionally doped InGaAsP layer 28; a p-InP second cladding layer 30; and a p-InGaAs (or p-InGaAsP) contact-facilitating layer 32. Layer 28 includes crescent-shaped active region 12 which, in practice, becomes separated from the remainder of layer 28 because epitaxial growth does not take place along the top edges of the groove 24. Provided that nonradiative recombination at the interface with high resistivity layer 20 is not significant, the active layer is preferably vertically positioned within the thickness of the high resistivity layer 20 in order to reduce leakage current. However, if the active layer is below layer 20, but near enough thereto (i.e., $\leq 1$ μm away), leakage currents are still significantly reduced and nonradiative recombination at the layer 20 interface becomes much less of a problem.

Although the high resistivity InP:Ti layer 20 is formed directly on the substrate 22, it may also be formed on an epitaxial buffer layer (not shown) grown on the substrate. In either base, we have found that high resistivity of layer 20 is best achieved by the MOCVD process described by A. G. Dentai et al. in the copending application described above.

Relatively thick (e.g., 1–4 μm) InP:Ti layers with resistivities greater $1 \times 10^7$ Ω-cm are achievable by this process which is also applicable to other InP-based compositions (e.g., InGaP, InAsP, InGaAsP, InGaAlP) and to GaSb-based compositions (e.g., InGaSb, InGaAsSb, AlGaSb, AlGaAsSb). For CSBH InP/InGaAsP lasers, however, a resistivity in excess of about $1 \times 10^6$ Ω-cm is desirable.

The high resistivity layer so prepared maintains its high resistivity even after being subjected to the high temperatures of subsequent crystal growth steps.

Electrical contact is made to the device via metal electrodes 34 and 36 on layer 32 and substrate 22, respectively. Source 16 is connected across electrodes 34 and 36.

Figure 2:
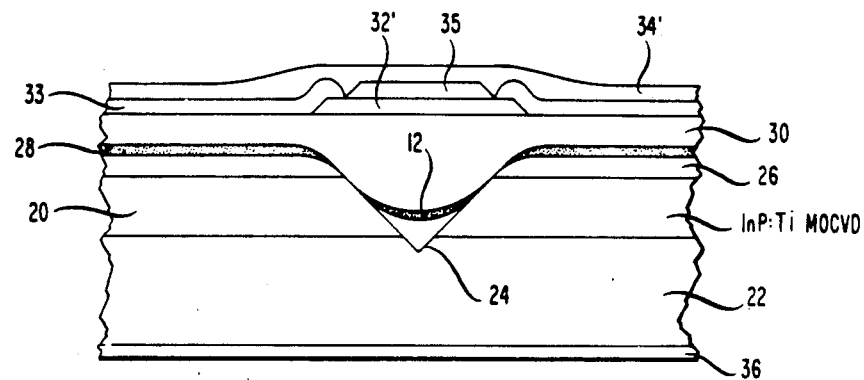
FIG. 2 is an end view of another embodiment of a CSBH device in accordance with the principles of our invention.

Although a broad-area contact is depicted in FIG. 1 by layer 32 and electrode 34, it also is possible to delineate a stripe geometry contact as shown in FIG. 2. Here components with primed notation in FIG. 2 correspond to those with the same reference numerals in FIG. 1. Thus, the contact-facilitating layer 32' is etched to form a stripe and is aligned within the stripe-shaped opening of $SiO_2$ layer 33. A stripe-shaped metal contact 35 is formed on layer 32' in the opening of $SiO_2$ layer 33, and a broad area electrode 34' is then formed over the top of the device. A contact configuration of this type reduces device capacitance and hence increases high speed performance.

The CSBH laser also includes means for providing optical feedback of the stimulated emission, typically a pair of separated, parallel, cleaved facets 38 and 40 which form an optical cavity resonator as shown in FIG. 1. The optical axis of the resonator and the elongated direction of the stripe-shaped active region 12 are generally parallel to one another. Other feedback techniques are also suitable, however, including well-known distributed feedback gratings, for example.

EXAMPLE

The following example describes the fabrication of an InP/InGaAsP CSBH laser in accordance with one embodiment of our invention. Unless otherwise stated, various materials, dimensions, concentrations, operating parameters, etc., are given by way of illustration only and are not intended to limit the scope of the invention.

The CSBH lasers, of the type shown in FIG. 2, may be fabricated as follows. By using an MOCVD epitaxial reactor a single layer 20 of Ti-doped InP was grown on an n-type InP substrate 22 (S-doped LEC material) nominally oriented along the (100) plane (no intentional misorientation was employed).

The Ti-doped layer is between 1 and 4 μm thick and has a resistivity of at least $1 \times 10^3$ Ω-cm. Then a composite native oxide/$SiO_2$ etching mask is deposited as described in the aforementioned U.S. Pat. No. 4,595,454. The mask was patterned into 2.0 μm wide windows, and the V-groove 24 for subsequent LPE growth is etched in a mixture of 3:1 $HCl:H_3PO_4$. The mask is then stripped in HF, and the wafer is loaded into a LPE reactor. Prior to the LPE growth, the wafer was protected in an external chamber containing a saturated Sn-In-P solution as described by P. R. Besomi et al. in U.S. Pat. No. 4,482,423 issued Nov. 13, 1986, which is incorporated herein by reference. The DH (layers 26, 28 and 30) is then grown by LPE at approximately 630° C. These layers included an n-type InP (Sn-doped) layer 26, a nominally undoped InGaAsP ($\lambda_g \approx 1.3$ μm) layer 28, and a p-type InP (Zn-doped) layer 30. On the DH a contact-facilitating p-type InGaAsP ($\lambda_g \approx 1.2$ μm, Zn-doped) layer was grown and later etched as described below. The width and thickness of the crescent-shaped active region 12 are typically 2.5 μm and 0.2 μm, respectively. Care is taken to grow the active region in the channel and within the thickness of the high resistivity layer 20 in order to reduce leakage current and shunt capacitance. However, even when the active layer was below layer 20, but within about 1 μm of it, the laser performance exceeded that of prior designs (i.e., either those with Cd-diffused base structures or Fe-ion implanted base structures).

After the LPE growth has been completed, standard channeled substrate buried heterostructure laser processing is performed. First, $SiO_2$ is deposited over the surface of the wafer ad patterned into stripes directly over the buried active regions, with the alignment performed by etching of the wafer edges to reveal the buried structure. The contact facilitating layer of the structure is then etched in 10:1:1 ($H_2SO_4$:$H_2O_2$:$H_2O$) to leave InGaAsP stripes 32' as shown in FIG. 2, and the $SiO_2$ etch mask is stripped in HF. Another $SiO_2$ layer 33 was then deposited and patterned to form windows over the stripes of layer 32'. The photoresist used in patterning the $SiO_2$ layer 33 is then used as a liftoff mask for an evaporated AuZnAu contact 35. After alloying the AuZnAu contact 35, the wfer (substrate) is lapped and a back (n-side) contact pad of AuGe was deposited and alloyed, using a similar liftoff technique. A front (p-side) TiPt overlay metallization (not shown) is deposited and sintered, and both front and back sides of the wafer are plated with Au layers 34' and 36 to serve as contacts and as bonding pads. Finally, the wafer is scribed and cleaved into individual chips 250 μm long by 500 μm wide.

It is to be understood that the above-described arrangements and techniques are merely illustrative of the many possible specific embodiments which can be devised to represent application of the principles of the invention. Numerous and varied other arrangements can be devised in accordance with these principles by those skilled in the art without departing from the spirit and scope of the invention. In particular, while our invention has been discussed with reference to lasers and LEDs, it will be appreciated by those skilled in the art that it is applicable to other semiconductor devices (e.g., photodiodes, multi-quantum well dvices and FETs) in which current is constrained to flow in a channel through an active region.

Figure 3:
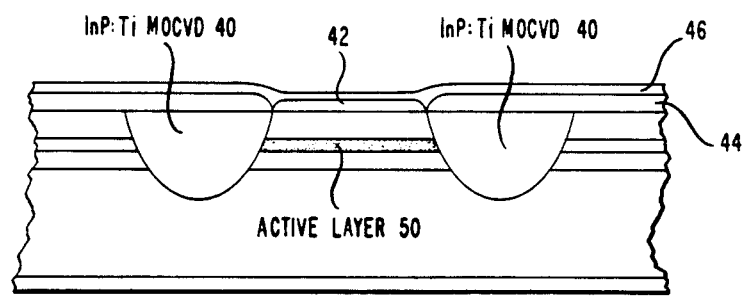
FIG. 3 is an end view of a DC-PBH device in accordance with the principles of our invention.

One alternative laser embodiment of our invention involves the double channel planar buried heterostructure (DCPBH). The conventional DCPBH laser is described generally by I. Mito et al. in *Journal of Lightwave Technology*, Vol. LT-1, No. 1, p.195 (1983). It employs LPE regrowth in the channels to form reverse-biased blocking junctions which constrain current to flow through the elongated mesa containing the active layer. In accordance with the DCPBH embodiment of our invention shown in FIG. 3, however, the LPE regrowth of blocking junctions is replaced by MOCVD growth of InP:Ti zones 40 on each side of the mesa. A restricted (e.g., stripe geometry) contact 42 is delineated on top of the mesa by a patterned dielectric layer 44 (e.g., $SiO_2$) and an electrode 46 overlays the top of the device. In this fashion, current is constrained by the InP:Ti zones 40 and the dielectric layer 44 to flow essentially only through the mesa and hence through the active layer 50.

Finally, it is well known that the active region of the devices described above may include a single active layer or a composite of several layers at least one of which is active (in the light-emitting sense). Thus, in a 1.55 μm InP/InGaAsP laser, the active region may include an InGaAsP layer which emits light at 1.55 μm adjacent another InGaAsP layer (λ=1.3 μm) which serves an anti-meltback function during LPE growth. Moreover, several active layers emitting at different wavelengths are also embraced within the definition of an active region.

What is claimed is:

1. A semiconductor device comprising an active region for conducting current and means for constraining said current to flow substantially in said active region, said semiconductor device characterized in that
   said constraining means comprises an epitaxially grown, Ti-doped, Group III-V based layer in contact with at least a first predetermined portion of said active region and said layer exhibits a resistivity exceeding $10^3$ Ω-cm.

2. The semiconductor device defined in claim 1 wherein said epitaxially grown layer includes doping compositions selected from the group consisting of iron, cadmium, beryllium, magnesium, zinc and germanium.

3. The semiconductor device defined in claim 2 wherein the epitaxially grown layer comprises InP.

4. A light emitting device comprising
   an InP body,
   a heterostructure including InP and InGaAsP layers and in a limited area thereof an active region which is responsive to pumping current to generate optical radiation,
   electrode means for applying said pumping current to said device, and
   means for constraining said pumping current to flow in a channel through said active region,
   characterized in that
   said constraining means comprises a high resistivity Ti-doped InP-based epitaxially grown layer formed on said body.

5. The device of claim 4 for use as a laser wherein said active region has the shape of an elongated stripe and including means forming an optical cavity resonator having its optical axis essentially parallel to the elongated direction of said stripe.

6. The device of claim 5 wherein the cross-section of said active region transverse to its elongated direction has the shape of a crescent.

7. The device of claim 6 wherein said Ti-doped InP-based epitaxially grown layer is bifurcated by an essentially rectangular opening in which said stripe-shaped active region lies.

8. The device of claim 7 wherein said opening is formed by a groove which extends through said Ti-doped epitaxially grown layer into said body, a portion of said heterostructure filling said groove and said stripe-shaped active region being situated in said groove and not more than about 1 μm below said Ti-doped layer.

9. The device of claim 8 wherein said active region lies within the thickness of said Ti-doped layer.

10. The semiconductor device defined in claim 9 wherein said epitaxially grown layer includes doping compositions selected from the group consisting of iron, cadmium, beryllium, magnesium, zinc and germanium.

11. The device of claim 10 wherein said Ti-doped layer comprises InP and its resistivity exceeds approximately $10^3$ Ω-cm.

12. A light emitting device comprising
    a heterostructure of InP and InGaAsP layers formed in the shape of an elongated mesa bounded on opposite sides by channels and including an active layer which is responsive to pumping current to generate optical radiation, electrode means for applying said pumping current to said device, and means within said channels for constraining said pumping current to flow through said mesa, characterized in that said constraining mans comprises a high resistivity Ti-doped InP-based epitaxially grown layer formed in said channels.

13. The light emitting device defined in claim 12 wherein said epitaxially grown layer includes doping compositions selected from the group consisting of iron, cadmium, beryllium, magnesium, zinc and germanium.

14. The light emitting device of claim 13 wherein the said Ti-doped layer comprises InP and its resistivity exceeds approximately $10^3$ $\Omega$-cm.

* * * * *